United States Patent
Hung et al.

(10) Patent No.: US 12,483,234 B2
(45) Date of Patent: Nov. 25, 2025

(54) SWITCH TRANSISTOR PROTECTION DEVICE AND ELECTRIC CIRCUIT DEVICE USING THE SAME

(71) Applicant: NUVOTON TECHNOLOGY CORPORATION, Hsinchu (TW)

(72) Inventors: Jui-Hsiao Hung, Hsinchu (TW); Chun-Ku Lin, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 216 days.

(21) Appl. No.: 18/325,276

(22) Filed: May 30, 2023

(65) Prior Publication Data

US 2024/0063784 A1    Feb. 22, 2024

(30) Foreign Application Priority Data

Aug. 19, 2022   (TW) .................................. 111131375

(51) Int. Cl.

| | |
|---|---|
| *H03K 17/0812* | (2006.01) |
| *H03K 17/10* | (2006.01) |
| *H03K 17/14* | (2006.01) |
| *H03K 17/687* | (2006.01) |

(52) U.S. Cl.
CPC ..... *H03K 17/08122* (2013.01); *H03K 17/102* (2013.01); *H03K 17/145* (2013.01); *H03K 17/687* (2013.01)

(58) Field of Classification Search
CPC .......... H03K 17/08122; H03K 17/102; H03K 17/145; H03K 17/687; H03K 17/08; H02H 3/10; H02H 3/02; H02H 5/04

USPC ............................................................ 361/56
See application file for complete search history.

(56) References Cited

U.S. PATENT DOCUMENTS

| | | | | |
|---|---|---|---|---|
| 5,761,020 | A | * | 6/1998 | Nadd ................. H03K 17/0822 361/103 |
| 7,940,505 | B1 | * | 5/2011 | Sadate ............... H03K 17/0822 361/87 |
| 2009/0224804 | A1 | * | 9/2009 | Noda ....................... G01K 7/01 327/512 |
| 2010/0321845 | A1 | * | 12/2010 | Imura ..................... G05F 1/569 361/86 |
| 2021/0006243 | A1 | * | 1/2021 | Takagiwa ......... H03K 17/08128 |

* cited by examiner

*Primary Examiner* — Sreeya Sreevatsa
(74) *Attorney, Agent, or Firm* — MUNCY, GEISSLER, OLDS & LOWE, P.C.

(57) ABSTRACT

A switch transistor protection device includes a voltage/current detection device and a determination device. The voltage/current detection device is electrically connected to a switch transistor, and used to detect a voltage of the gate, the body, the source or the drain of the switch transistor, or used to detect a current of the source or the drain of the switch transistor to generate a reference voltage. The determination device is electrically connected to the voltage/current detection device and the switch transistor, and used to determine whether the reference voltage exceeds an overcurrent voltage or a fixed maximum junction temperature voltage corresponding to a maximum junction temperature of the switch transistor. When the determination device determines the reference voltage exceeds the maximum junction temperature voltage or the overcurrent voltage, the determination device generates a control signal to the gate, the body, the source or the drain of the switch transistor.

16 Claims, 6 Drawing Sheets

SWITCH TRANSISTOR PROTECTION DEVICE AND ELECTRIC CIRCUIT DEVICE USING THE SAME

CROSS-REFERENCE TO RELATED APPLICATION

This application claims the priority from the TW Patent Application No. 111131375, filed on Aug. 19, 2022, and all contents of such TW Patent Application are included in the present disclosure.

BACKGROUND OF THE INVENTION

1. Field of the Invention

The present disclosure relates to a circuit protection technology utilized to prevent an electric circuit device from burning out, in particular to, a switch transistor protection device and an electric circuit device using the same which can prevent a switch transistor from burning out by using a maximum junction temperature of the switch transistor in the circuit system device as a comparison reference.

2. Description of the Related Art

For circuit system devices, supply security and reliability of the power supply are very important; with heavy load, a cross-voltage on a switch transistor of the circuit system device increases accordingly. Taking the switch transistor being a MOS transistor as an example, the cross-voltage of the MOS transistor is a drain-source voltage VDS, and VDS=Vin−Vout, Vin is an input voltage and Vout is an output voltage; when the overload current flows through the switch transistor, the larger power consumption is generated, which results in overheating of the switch transistor. Also, the power consumption of the switch transistor makes the switch transistor hotter with time; that is, a junction temperature of the switch transistor is higher. Thus, when the switch transistor is used for a long time, the overall component characteristics will be damaged.

The conventional circuit protection device is designed to ensure that the switch transistor is operated within a safe operating area (SOA). For safe operating area, the maximum power consumption of the switch transistor is determined based on the maximum junction temperature that the switch transistor can endure. Practically, the above-mentioned circuit protection device is a power limiting protection device for preventing a switch power transistor from operating out of the safe operating area. In addition to the above implementation manners, the circuit protection device can be designed as an over-current protection (OCP) device or an over-temperature protection (OTP) device. However, regardless of which one of the implementation manners, it requires utilizing the complex data of the safe operating area to design. As well, it is difficult to ensure that the switch transistor operates within the maximum margin of the safe operating area.

SUMMARY OF THE INVENTION

Based on the one of the purposes of the present disclosure, the present disclosure provides a switch transistor protection device. The switch transistor protection device is configured in a switch transistor of a protection circuit device. The switch transistor protection device comprises a voltage/current detection device and a determination device. The voltage/current detection device is electrically connected to the switch transistor. The voltage/current detection device is configured to detect a voltage of the gate, the body, the source or the drain of the switch transistor, or detect a current of the source or the drain of the switch transistor, so as to generate a reference voltage accordingly. The determination device is electrically connected to the voltage/current detection device and the switch transistor. The determination device is configured to determine whether the reference voltage exceeds an overcurrent voltage or a maximum junction temperature voltage corresponding to a maximum junction temperature of the switch transistor. When the determination device determines the reference voltage exceeds the maximum junction temperature voltage or the overcurrent voltage, the determination device generates a control signal to the gate, the body, the source or the drain of the switch transistor.

Based on one of the purposes of the present disclosure, the present disclosure provides an electric circuit device. The electric circuit device comprises the mentioned switch transistor protection device and a functional circuit.

To sum up, the switch transistor protection device and the electric circuit device using the same provided by the embodiments of the present disclosure can simultaneously achieve power limitation, over-temperature protection and over-current protection mechanisms via utilizing the "single temperature" parameter. Therefore, there are technical effects such as simple parameter acquisition and achievement of maximum margin.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

DESCRIPTION OF THE PREFERRED EMBODIMENTS

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

A main purpose of the present disclosure is to utilize the "single temperature" parameter to achieve power limitation, over-temperature protection and over-current protection mechanisms simultaneously. When the power limitation or the over-current protection occurs, the corresponding power and current can be converted into a corresponding specific temperature practically. Thus, it is sufficient to limit and keep the temperature of the switch transistor at a specific temperature. In practice, the corresponding overcurrent or overcurrent voltage is set based on the specific temperature, and the voltage or current fed back by the switch transistor is kept not exceeding the overcurrent voltage or overcurrent. When the over-temperature protection occurs, the specific voltage or specific current corresponding to the maximum junction temperature of the switch transistor can be directly used as the limitation. The voltage or current fed back by the switch transistor can be prevented from exceeding the specific voltage or current corresponding to the maximum junction temperature, so as to keep the temperature of the switch transistor and make the temperature of the switch transistor closed to the maximum junction temperature. In this way, the problems of the maximum margin that cannot be achieved in the related art can be solved.

On the other hand, compared with the complex parameters which are difficult to obtain, such as process parameters of the switch transistor, the specific voltage or the specific current corresponding to the maximum junction temperature of the switch transistor is a fixed parameter, and the maximum junction temperature is a physical parameter which can be obtained more easily. Further, the overcurrent voltage and the overcurrent can be determined by a user. Therefore, the present disclosure utilizes the "single temperature" parameter to simultaneously achieve power limitation, over-temperature protection and over-current protection mechanisms, and there is no need to use other parameters to achieve those mechanisms.

Figure 1:
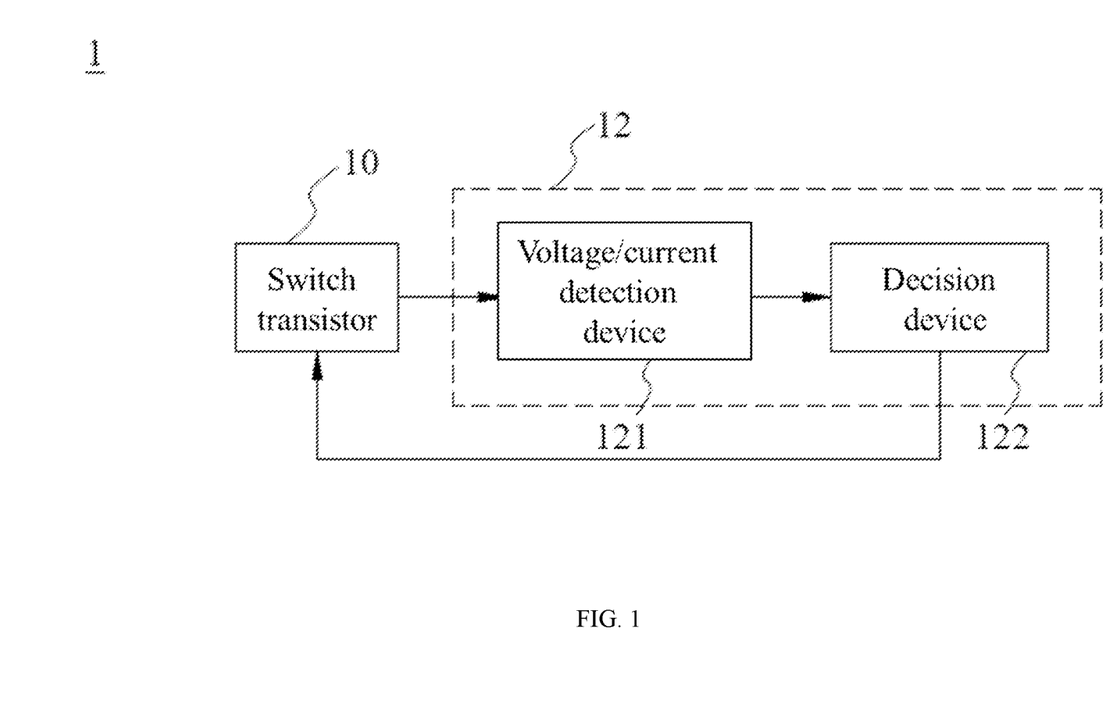
FIG. 1 is a block diagram of a switch transistor protection device and an electric circuit device using the same according to a first embodiment of the present disclosure.

Firstly, please refer to FIG. 1 of the present disclosure. FIG. 1 is a block diagram of a switch transistor protection device and an electric circuit device using the same according to a first embodiment of the present disclosure. An electric circuit device 1 includes a functional circuit (not shown in figures) and at least one switch transistor protection device 12. The functional circuit includes at least one switch transistor 10. The switch transistor 10 is electrically connected to the switch transistor protection device 12. The switch transistor protection device 12 includes a voltage/current detection device 121 and a determination device 122. The voltage/current detection device 121 and the determination device 122 are electrically connected to each other.

The switch transistor 10 is electrically connected to the voltage/current detection device 121 and the determination device 122.

Further, the voltage/current detection device 121 is configured to detect a voltage of the gate, the body, the source or the drain of the switch transistor 10, or the voltage/current detection device 121 is configured to detect a current of the source or the drain of the switch transistor 10, so as to generate a reference voltage accordingly. The determination device 122 is configured to determine whether the reference voltage exceeds the overcurrent voltage set by a user or a fixed specific voltage. Besides, the overcurrent voltage may be generated by setting an overcurrent, and the fixed specific voltage is determined by a maximum junction temperature of the switch transistor 10. When the determination device 122 determines the reference voltage exceeds one of the fixed specific voltage and the overcurrent voltage set by the user, the determination device 122 generates a control signal to the gate, the body, the source or the drain of the switch transistor 10. As a result, the switch transistor 10 is prevented from being burnt out due to continuous operation, so as to achieve the protection of the switch transistor 10.

In the present disclosure, what needs to be set by the user is only the value of overcurrent, and the overcurrent is practically related to the temperature. Since the maximum junction temperature is fixed and cannot be adjusted by the user, and the maximum junction temperature is the highest operating temperature related to the semiconductor process technology and determined when the semiconductor component leaves the factory, it is no need to concern that the switch transistor 10 will be burnt out even of the overcurrent is set too high. This is because the reference voltage will exceed the fixed specific voltage corresponding to the maximum junction temperature firstly, and thus the switch transistor 10 is blocked from operating.

On the other hand, in order to prevent the accuracy and stability of the mentioned temperature control structure from interfering with noise and glitch, a filter may be configured in front of the switch transistor 10, or a filter is configured between the determination device 122 and the switch transistor 10 in other embodiments. Moreover, the filter may include a resistor and a capacitor, include a current source and a capacitor, or include a current source, a resistor and a capacitor, or include a switch transistor, a resistor, a capacitor and a current source; however, the present disclosure is not limited by the exemplary types of the filter.

In addition, in some situations, the junction temperature of the switch transistor 10 may rise suddenly. In this situation, in order to prevent the determination device 122 from turning off the switch transistor 10 too late, in other embodiments of the present disclosure, a quick-pull circuit is configured in front of the switch transistor 10, or a quick-pull circuit is configured between the switch transistor 10 and the determination device 122. The quick-pull circuit is used to prevent the switch transistor 10 from being burnt out due to the junction temperature of the switch transistor 10 rising suddenly. The quick-pull circuit may be implemented via, for example, a switch transistor, and the present disclosure is not limited thereto.

Figure 2:
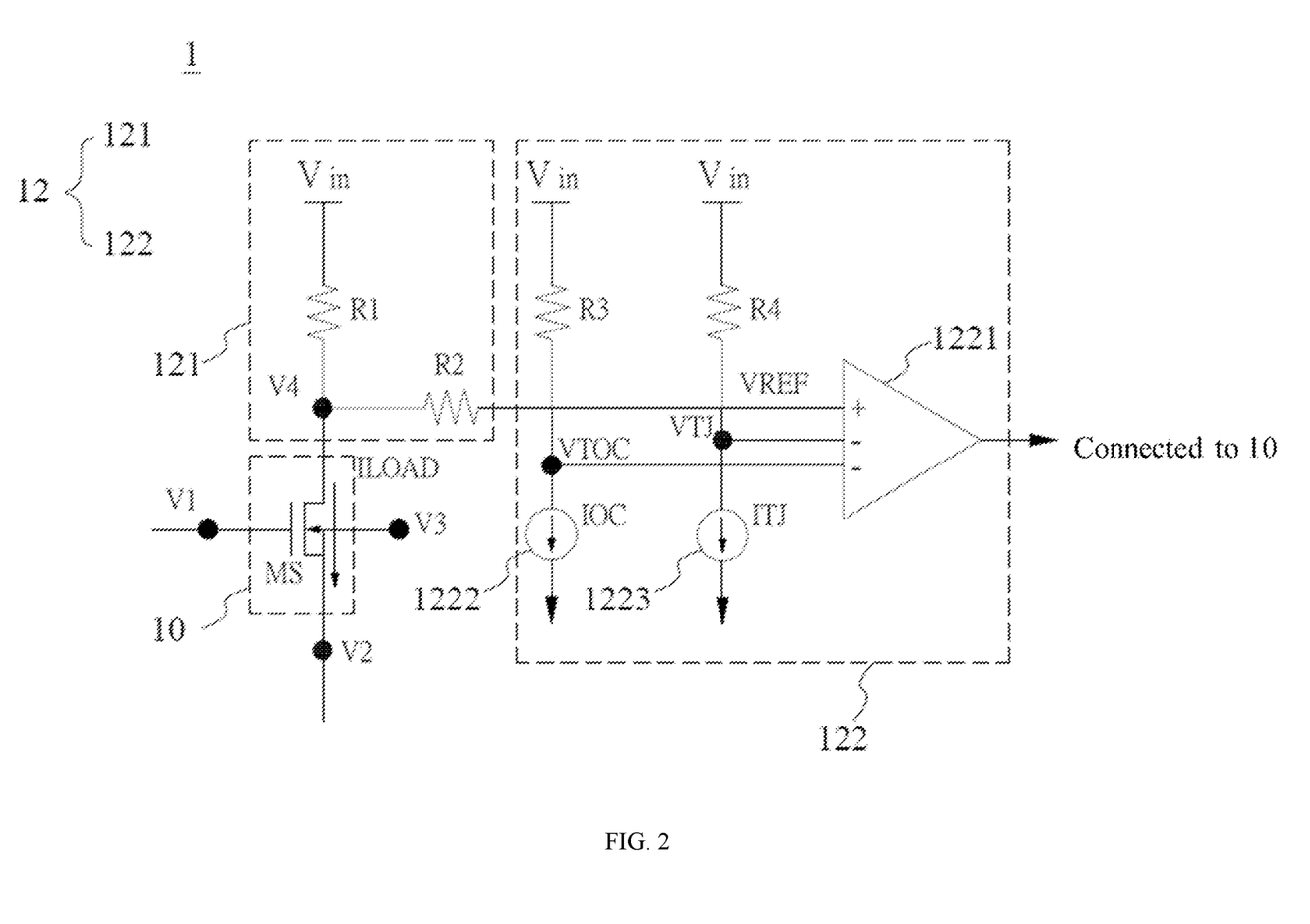
FIG. 2 is a block diagram of a switch transistor protection device and an electric circuit device using the same according to a second embodiment of the present disclosure.

Please refer to FIG. 2. FIG. 2 is a circuit diagram of a switch transistor protection device and an electric circuit device using the same according to a second embodiment of the present disclosure. In this embodiment, the switch transistor protection device 12 is a voltage-detection-type switch transistor protection device, and the switch transistor 10 is implemented by a depletion NMOS transistor MS. During operation, a current ILOAD generated flows through the source and the drain of the NMOS transistor MS, and a voltage V4 on the drain of the NMOS transistor MS is detected. The voltage/current detection device 121 includes resistors R1 and R2. Through the resistors R1 and R2, the voltage V4 on the drain of the NMOS transistor MS can be detected. Also, correspondingly, a reference voltage VREF can be generated at one end of the resistor R2 to the determination device 122.

Further, one end of the resistor R1 is configured to receive an input voltage Vin, and one end of the resistor R2 is electrically connected to the positive input end of the comparator 1221 of the determination device 122. The other end of the resistor R1 is electrically connected to the other end of the resistor R2. The other end of the resistor R1 and the other end of the resistor R2 are electrically connected to the drain of the NMOS transistor MS to receive the voltage V4. In this embodiment, the control signal generated by the determination device 122 is transmitted to the gate of the NMOS transistor MS to adjust a voltage V1, so as to prevent the NMOS transistor MS from being burnt out. However, in other embodiments, the control signal generated by the determination device 122 may be transmitted to the body, the source or the drain of the NMOS transistor MS to adjust a voltage V3, V2 or V4. Therefore, the NMOS transistor MS is prevented from being burnt out.

The determination device 122 includes the comparator 1221, resistors R3 and R4, current sources 1222 and 1223. One end of the resistor R3 is configured to receive the input voltage Vin, and the other end of the resistor R3 is electrically connected to one end of the current source 1222 and one negative input end of the comparator 1221. One end of the resistor R4 is configured to receive the input voltage Vin, and the other end of the resistor R4 is electrically connected to one end of the current source 1223 and the other negative input end of the comparator 1221. The current source 1222 is configured to provide an overcurrent IOC, and the current source 1223 is configured to provide a maximum junction temperature current ITJ. Thus, an overcurrent voltage VTOC is generated at the other end of the resistor R3, and a maximum junction temperature voltage VTJ is generated at the other end of the resistor R4. Besides, the maximum junction temperature current ITJ is the aforementioned specific current determined via the maximum junction temperature of the switch transistor 10, and the maximum junction temperature voltage VTJ is the aforementioned fixed specific voltage determined via the maximum junction temperature of the switch transistor 10. As mentioned above, the overcurrent IOC can be adjusted according to the user's determination. As well, the maximum junction temperature current ITJ is determined by the switch transistor 10. The maximum junction temperature current ITJ is a physical parameter of the switch transistor 10, and is only related to the type of the switch transistor 10.

Figure 3:
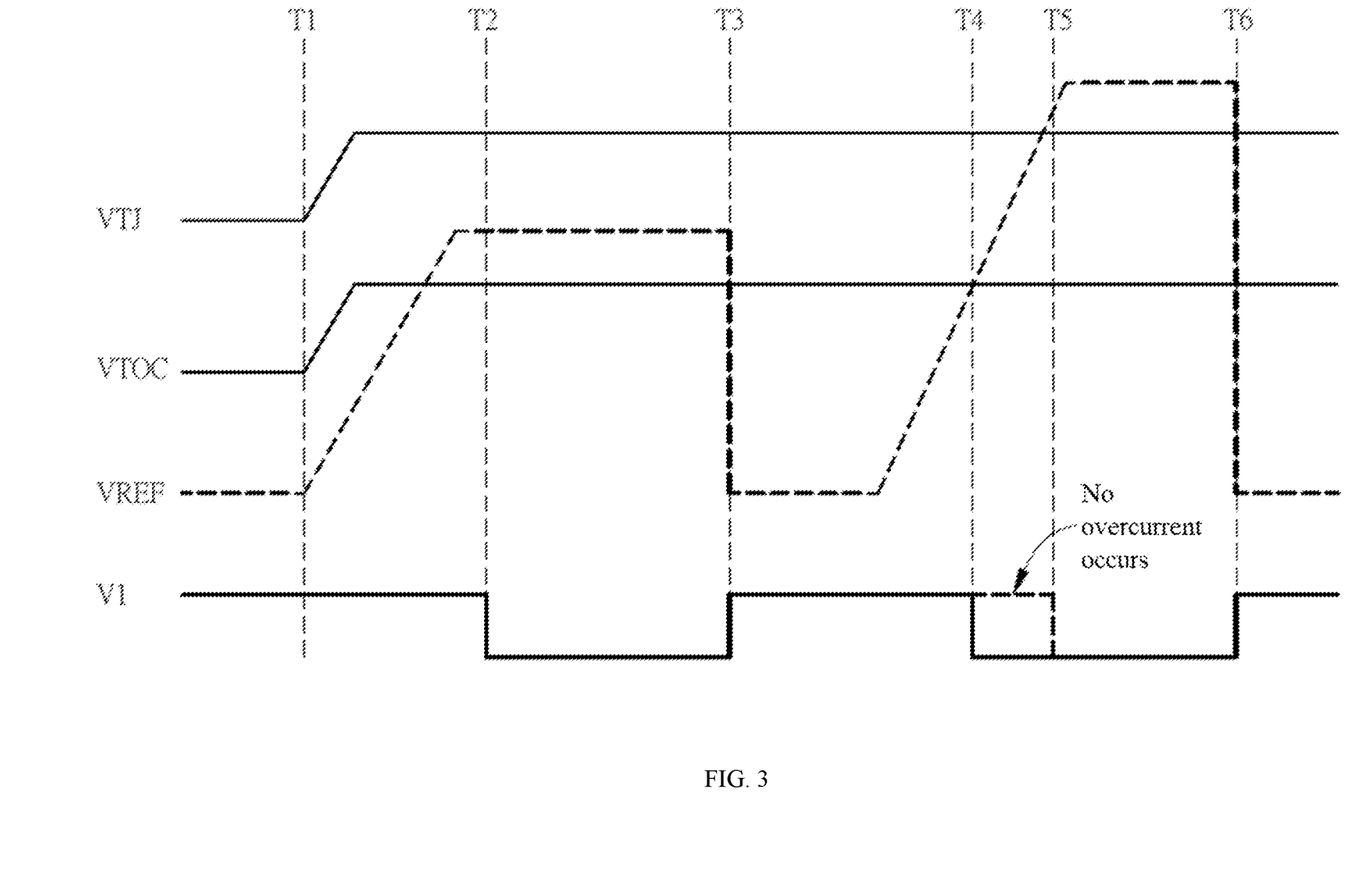
FIG. 3 is a waveform diagram of some signals in the electric circuit device according to the second embodiment of the present disclosure.

Please refer to FIG. 2 and FIG. 3 at the same time. FIG. 3 is a waveform diagram of some signal in the electric circuit device according to the second embodiment of the present disclosure. The time T1 is an actuation time point of the electric circuit device 1. After the time T1, the overcurrent voltage VTOC and the maximum junction temperature voltage VTJ start to rise to a specific voltage, the transistor is turned on, the voltage V1 is a logic high voltage, and the reference voltage VREF rises upwardly. At the time T2, the reference voltage VREF is just close to and slightly greater than the overcurrent voltage VTOC. Thus, the determination device 122 outputs the control signal to adjust the voltage V1 to a logic low voltage to turn off the switch transistor 10 for protection.

By turning off the switch transistor 10 for protection, the reference voltage VREF drops to the logic low voltage at the time T3 the same as the voltage at the actuation time point. At this time, the switch transistor 10 is turned on again to perform the switch operation. At a time T4, the reference voltage VREF is close to and slightly greater than the overcurrent voltage VTOC. As well, at the time T5, which is not much different from the time T4, the reference voltage VREF suddenly rises to be greater than the maximum junction temperature voltage VTJ. Therefore, from the times T4 to T6, the determination device 122 outputs the control signal to adjust the voltage V1 to the logic low voltage, so as to turn off the switch transistor 10 for protection. By turning off the switch transistor 10 for protection, the reference voltage VREF drops to the logic low voltage at the time T6 the same as that at the actuation point. At this time, the switch transistor 10 is turned on again to perform the switch operation. It is noted here that, in this example, no overcurrent occurs during the time period T4 to T5 because the reference voltage VREF suddenly rises to be greater than the maximum junction temperature voltage VTJ at the time T5 which is not much different from the time T4.

Figure 4:
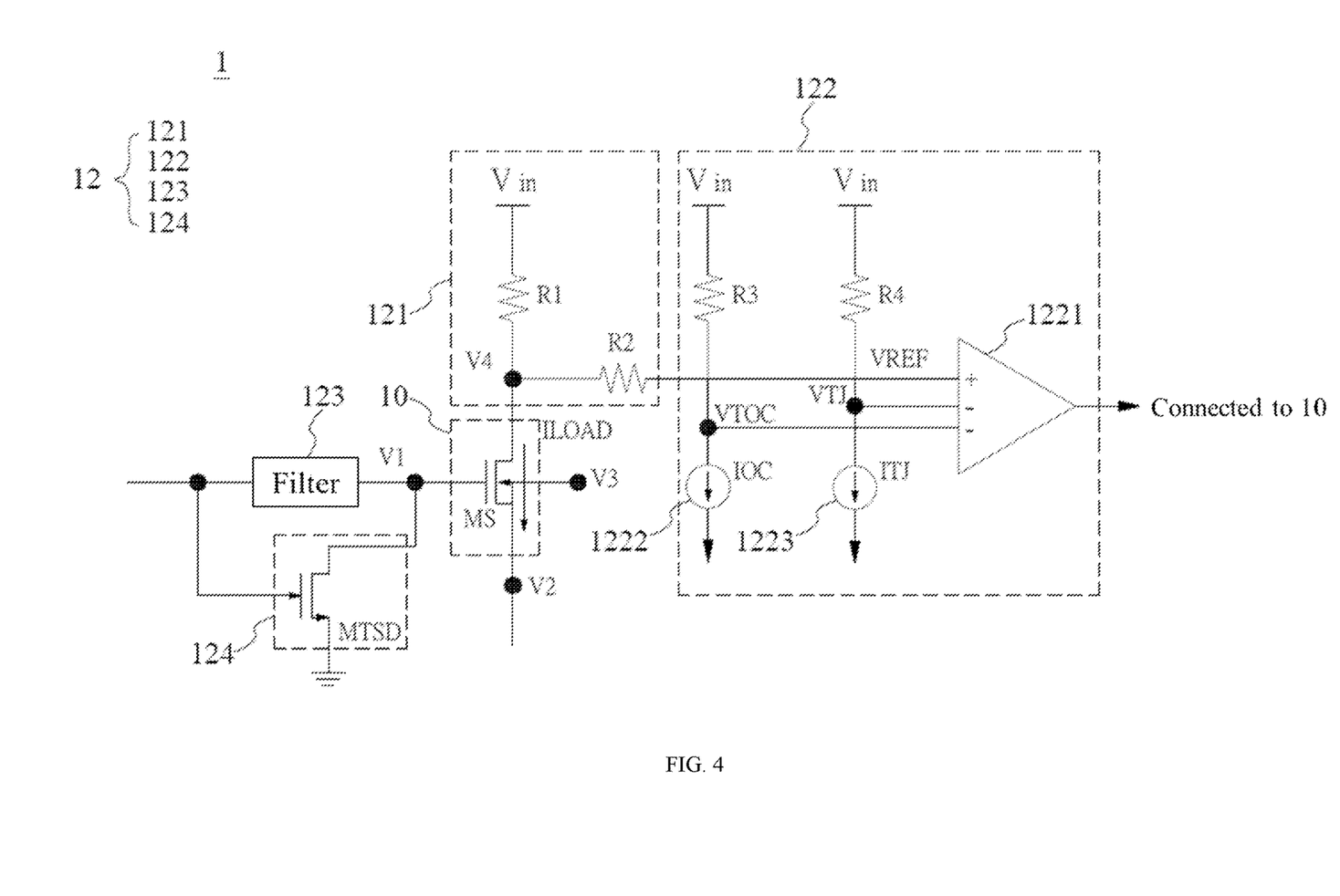
FIG. 4 is a circuit diagram of a switch transistor protection device and an electric circuit device using the same according to a third embodiment of the present disclosure.

Please refer to FIG. 4. FIG. 4 is a circuit diagram of a switch transistor protection device and an electric circuit device using the same according to a third embodiment of the present disclosure. In this embodiment, the switch transistor protection device 12 further includes a filter 123 and a quick-pull circuit 124. The filter 123 and the quick-pull circuit 124 may be configured in front of the gate of the NMOS transistor MS to receive a switch control signal of the switch transistor 10. The filter 123 is configured to prevent the switch transistor protection device 12 from interfering with noise and glitch. Therefore, after the switch control signal is filtered, the filtered switch control signal is output to the gate of the NMOS transistor MS of the switch transistor 10. The quick-pull circuit 124 is implemented by using an NMOS transistor MTSD. The gate of the NMOS transistor MTSD is configured to receive the switch control signal. The source of the NMOS transistor MTSD is electrically connected to a low voltage, and the low voltage may be, for example, a ground voltage. The drain of the NMOS transistor MTSD is electrically connected to the gate of the NMOS transistor MS. The NMOS transistor MTSD can be turned on when the junction temperature of the NMOS transistor MS rises suddenly. Thus, the switch transistor 10 is turned off quickly to prevent the switch transistor 10 from being burnt out.

Figure 5:
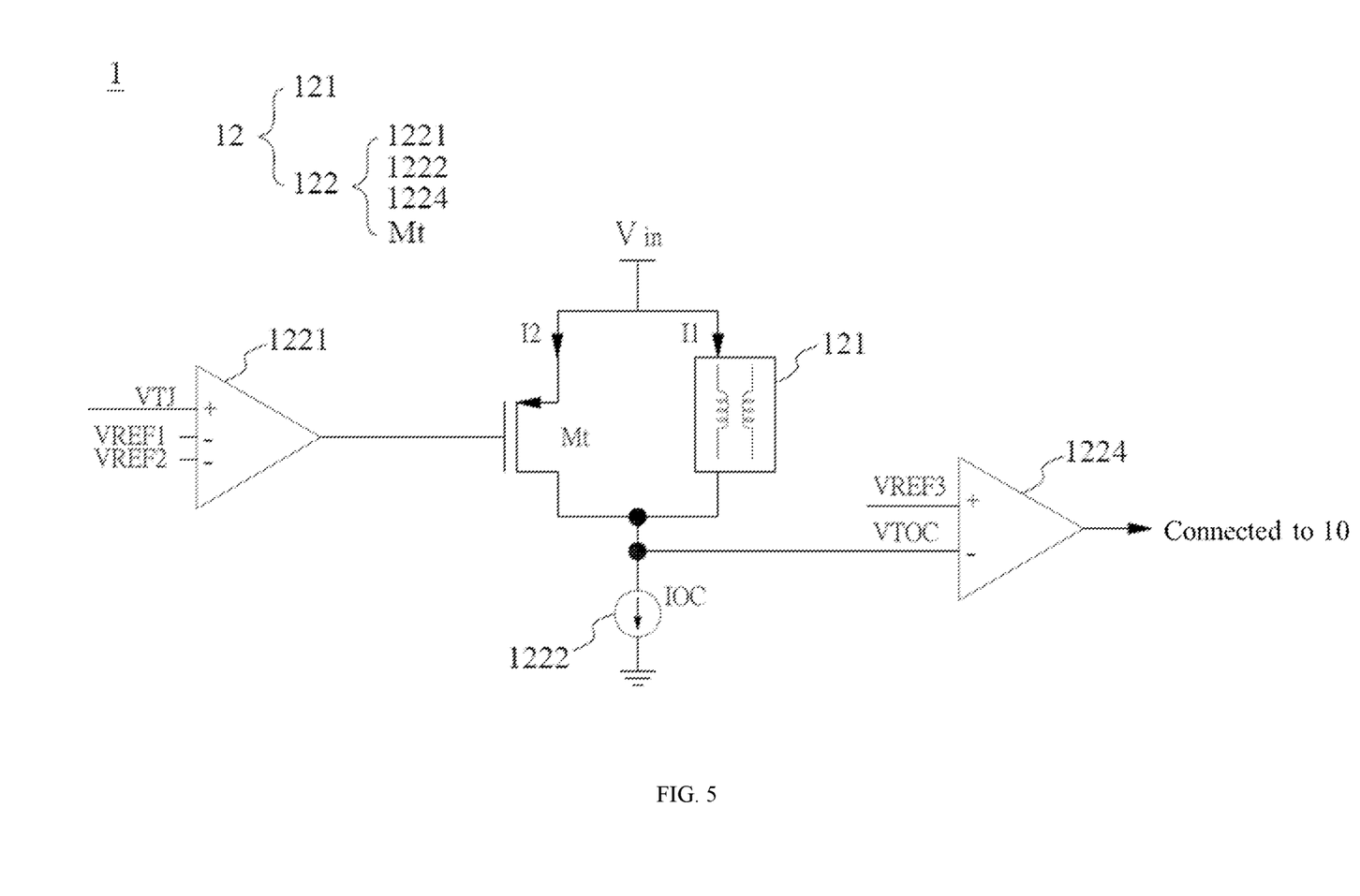
FIG. 5 is a circuit diagram of a switch transistor protection device and an electric circuit device using the same according to a fourth embodiment of the present disclosure.

Next, refer to FIG. 5. FIG. 5 is a circuit diagram of a switch transistor protection device and an electric circuit device using the same according to a fourth embodiment of the present disclosure. In this embodiment, the switch transistor protection device 12 is a current-detection-type switch transistor protection device, and the switch transistor 10 is implemented with a depletion NMOS transistor. Also, during operation, a generated current flows through the source and the drain of the switch transistor 10. The voltage/current detection device 121 includes a current sensor. The current sensor is configured to generate an induced current I1 via detecting the current flowing through the switch transistor 10. The induced current I1 may be K times the current flowing through the switch transistor 10. Moreover, K is a positive integer and depends on the turns-ratio of the coils of the current sensor. In this embodiment, the current sensor is bidirectional, but the present disclosure is not limited thereby, the current sensor can also be a unidirectional current sensor. That is, when the induced current I1 changes, the current flowing through the switch transistor 10 also changes. On the contrary, when the current flowing through the switch transistor 10 changes, the induced current I1 also changes.

The voltage/current detection device 121 further includes a reference voltage generator. The reference voltage generator is configured to generate three reference voltages VREF1~VREF3 accordingly. Further, the reference voltage VREF3 is a reference voltage generated via detecting the load current ILOAD of the NMOS transistor MS, which is the transistor used as a switch, as shown in FIG. 4. For example, the reference voltage VREF3 is equivalent to the voltage V4 on the drain of the NMOS transistor MS in FIG. 4. The reference voltage VREF1 is a voltage corresponding to the over-temperature determined by the user, and the reference voltage VREF2 is a voltage after the over-temperature determined by the use. It is used to generate a hysteresis effect. In other words, it makes the comparator 1221 to generate the hysteresis effect.

The determination device 122 includes comparators 1221 and 1224, a PMOS transistor Mt and a current source 1222. Two negative input ends of the comparator 1221 are configured to receive the reference voltages VREF1 and VREF2, respectively. The positive input end of the comparator 1221 is configured to receive the maximum junction temperature voltage VTJ. The output end of the comparator 1221 is electrically connected to the gate of the PMOS transistor Mt. The source of the PMOS transistor Mt is configured to receive the input voltage Vin. One end of the current source 1222 is electrically connected to the drain of the PMOS transistor Mt and one end of the voltage/current detection device 121 that outputs the induced current I1. The other end of the current source 1222 is electrically connected to the low voltage, such as the ground voltage. The negative input end of the comparator 1224 is electrically connected to the end of the current source 1222. The positive input end of the comparator 1224 is configured to receive the reference voltage VREF3. The output end of the comparator 1224 is electrically connected to the switch transistor 10 to output the control signal to the gate, the body, the source or the drain of the switch transistor 10.

The reference voltages VREF1 and VREF2 represent junction temperatures of the switch transistor 10. When the two reference voltages VREF1 and VREF2 are both lower than the maximum junction temperature voltage VTJ, it means that the junction temperature of the switch transistor 10 is lower than the maximum junction temperature. In this situation, the PMOS transistor Mt is turned off, so that a current I2 of the PMOS transistor Mt is 0. Thus, the overcurrent IOC provided by the current source 1222 is equivalent to the induced current I1. In this way, the switch transistor protection device 12 operates in the over-current mechanism. When the reference voltage V3 is greater than the overcurrent voltage VTOC set by the user, the control signal is generated to turn off the switch transistor 10. Thus, the temperature of the switch transistor 10 is reduced.

When one of the two reference voltages VREF1 and VREF2 is greater than the maximum junction temperature voltage VTJ, it means that the junction temperature of the switch transistor 10 is greater than the maximum junction temperature voltage. In this situation, the PMOS transistor Mt is turned on, so that the overcurrent IOC provided by the current source 1222 is equivalent to the induced current I1 plus the current I2. In this way, when the junction temperature increases, the current I2 increases, and the increase in the current I2 causes the induced current I1 to decrease. Consequently, the current flowing through the switch transistor 10 is reduced correspondingly, so that the temperature of the switch transistor 10 is reduced. Moreover, in principle, the reference voltage VREF3 is also greater than the overcurrent voltage VTOC at this time. Therefore, the switch transistor 10 is also controlled to be turned off at the same time, so as to reduce the temperature of the switch transistor 10. By the way, in one of the embodiments, the reference voltages VREF1-VREF2 may be the same reference voltage, the comparator 1221 may have only one negative input end, and the present disclosure is not limited thereto.

Figure 6:
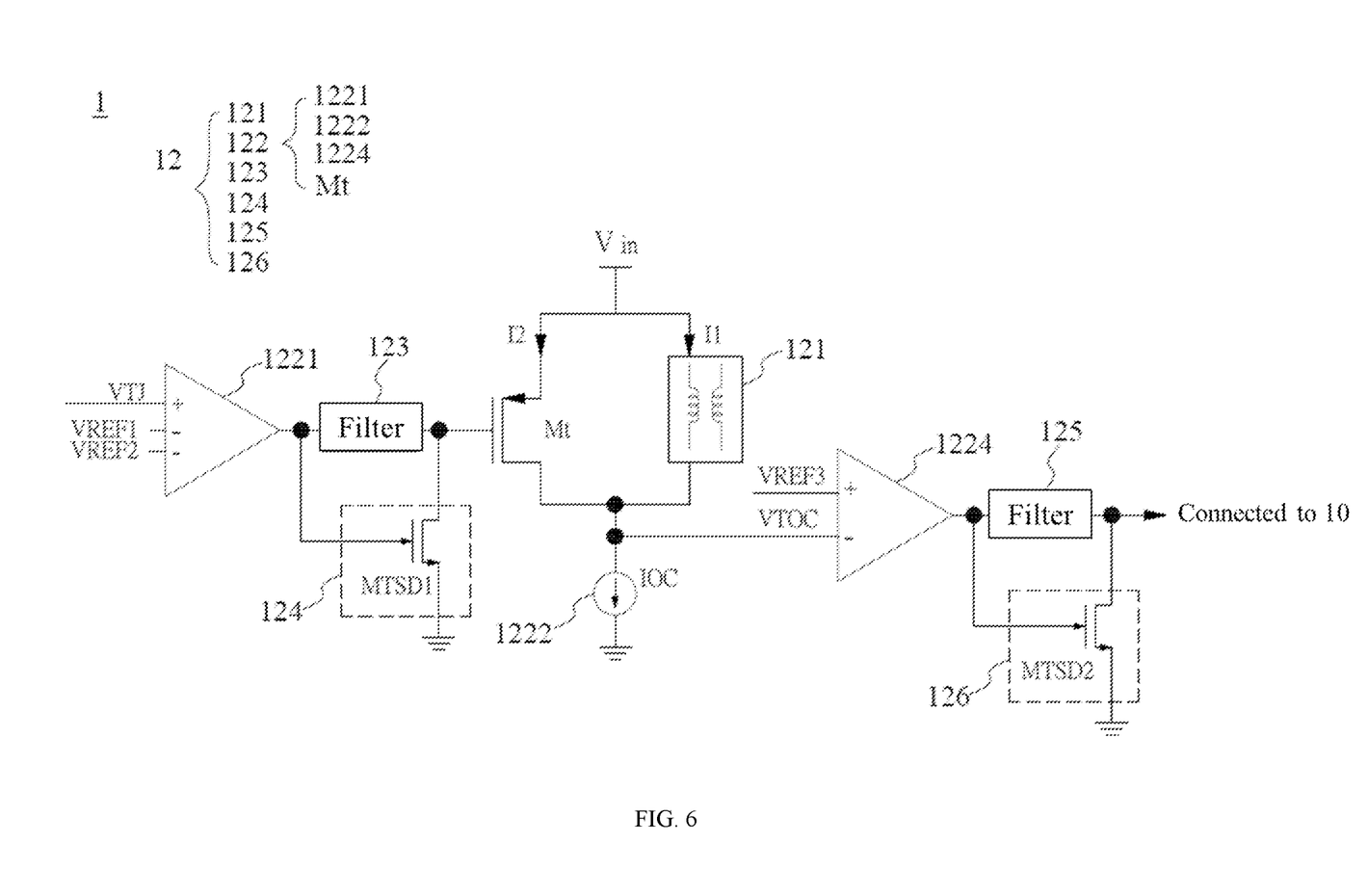
FIG. 6 is a circuit diagram of a switch transistor protection device and an electric circuit device using the same according to a fifth embodiment of the present disclosure.

Next, refer to FIG. 6. FIG. 6 is a circuit diagram of a switch transistor and an electric circuit device using the same according to a fifth embodiment of the present disclosure. Different from the last embodiments, in this embodiment, the switch transistor protection device 12 further includes filters 123, 125 and quick-pull circuits 124 and 126. The filter 123 is configured between the output end of the comparator 1221 and the gate of the PMOS transistor Mt. The filter 123 is configured to prevent the switch transistor 10 from burning out owing to erroneously turning on/off the PMOS transistor Mt by the noise and the glitch. The quick-pull circuit 124 includes an NMOS transistor MTSD1. The gate of the NMOS transistor MTSD1 is electrically connected to the output end of the comparator 1221. The source of the NMOS transistor MTSD1 is electrically connected to the low voltage, such as the ground voltage. The drain of the NMOS transistor MTSD1 is electrically connected to the gate of the PMOS transistor Mt. When the junction temperature of the switch transistor 10 rises suddenly, the PMOS transistor Mt can be quickly turned on by the quick-pull circuit 124 to reduce the temperature of the switch transistor 10.

The filter 125 is configured between the output end of the comparator 1224 and the gate of the switch transistor 10. The filter 125 is configured to prevent the switch transistor 10 from burning out owing to erroneously turning on/off the PMOS transistor Mt by the noise and the glitch. The quick-pull circuit 126 includes a NMOS transistor MTSD2. The gate of the NMOS transistor MTSD2 is electrically connected to the output end of the comparator 1221. The source of the NMOS transistor MTSD2 is electrically connected to the low voltage, such as the ground voltage. The drain of the NMOS transistor MTSD2 is electrically connected to the gate of the switch transistor 10. When the junction temperature of the switch transistor 10 rises suddenly, the switch transistor 10 can be quickly turned off by the quick-pull circuit 124 to reduce the temperature of the switch transistor 10.

As stated as above, the switch transistor protection device and the electric circuit device using the same provided by the embodiments of the present disclosure can utilize the "single temperature" parameter to simultaneously achieve power limit, over-temperature protection and over-current protection mechanisms. Thus, there is no need to obtain the process parameters of the switch transistor that are complicated and hard to obtain. The switch transistor protection device and the electric circuit device using the same provided by the embodiments of the present disclosure directly use the specific voltage or specific current corresponding to the maximum junction temperature of the switch transistor as the limitation. In this way, the voltage or current fed back by the switch transistor can be prevent from exceeding the specific voltage or the specific current corresponding to the maximum junction temperature, so as to keep the temperature of the switch transistor and the temperature of the switch transistor is close to the maximum junction temperature. Consequently, the maximum margin that was not possible in the past is achieved by the present disclosure.

Furthermore, in some embodiments, the switch transistor protection device and the electric circuit device using the same are further provided with a filter or and a quick-pull circuit to improve performance.

It should be understood that the examples and the embodiments described herein are for illustrative purpose only, and various modifications or changes in view of them will be suggested to those skilled in the art, and will be included in the spirit and scope of the application and the appendix with the scope of the claims.

What is claimed is:

1. A switch transistor protection device, configured in a switch transistor of a protection circuit device, and comprising:
   a voltage/current detection device, electrically connected to the switch transistor, and configured to detect a voltage of a gate, a body, a source or a drain of the switch transistor, or detect a current of the source or the drain of the switch transistor to generate a reference voltage accordingly; and
   a determination device, electrically connected to the voltage/current detection device and the switch transistor, and configured to determine whether the reference voltage exceeds an overcurrent voltage or a maximum junction temperature voltage, wherein the maximum junction temperature voltage is corresponding to a maximum junction temperature of the switch transistor, and
   wherein when the determination device determines the reference voltage exceeds the maximum junction temperature voltage or the overcurrent voltage, the determination device generates a control signal to the gate, the body, the source or the drain of the switch transistor;
   wherein the voltage/current detection device comprises a plurality of resistors, and the determination device comprises a comparator, and the plurality of resistors are electrically connected to the switch transistor to generate the reference voltage, and the comparator is configured to compare the reference voltage, the overcurrent voltage and the maximum junction temperature voltage.

2. The switch transistor protection device according to claim 1, further comprising a filter, and
   wherein the filter is electrically connected to the gate of the switch transistor, and the filter is configured to receive a switch control signal of the switch transistor.

3. The switch transistor protection device according to claim 2, further comprising a quick-pull circuit which comprises an NMOS transistor,
   wherein a gate of the NMOS transistor is configured to receive the switch control signal, a drain of the NMOS transistor is electrically connected to the gate of the switch transistor, and a source of the NMOS transistor is electrically connected to a low voltage.

4. The switch transistor protection device according to claim 1, wherein the voltage/current detection device comprises a current sensor, and the determination device comprises a first comparator, a second comparator, a current source and a PMOS transistor,
   wherein the current sensor is configured to generate an induced current via detecting a current flowing through the switch transistor, wherein the induced current and the current flowing through the switch transistor are changed in response to each other,
   wherein one end of the current source is connected to a negative input end of the second comparator, a drain of the PMOS transistor and one end of the current sensor generating the induced current, and configured to provide the overcurrent voltage,
   wherein the voltage/current detection device is configured to generate a first reference voltage, a second reference voltage and a third reference voltage,
   wherein the second comparator is configured to compare the third reference voltage and the overcurrent voltage to generate the control signal, and
   wherein an output end of the first comparator is electrically connected to a gate of the PMOS transistor, and the first comparator is configured to compare whether the first reference voltage or the second reference voltage is greater than the maximum junction temperature voltage to control the PMOS transistor to be turned on or off.

5. The switch transistor protection device according to claim 4, wherein the switch transistor protection device further comprises a first filter electrically connected between the output end of the first comparator and the gate of the PMOS transistor.

6. The switch transistor protection device according to claim 5, further comprising a first quick-pull circuit which comprises a first NMOS transistor, and
   wherein a gate of the first NMOS transistor is electrically connected to the output end of the first comparator, a drain of the first NMOS transistor is electrically connected to the gate of the PMOS transistor, and a source of the first NMOS transistor is electrically connected to a low voltage.

7. The switch transistor protection device according to claim 6, further comprising a second filter electrically connected between an output end of the second comparator and the gate of the switch transistor.

8. The switch transistor protection device according to claim 7, further comprising a second quick-pull circuit which comprises a second NMOS transistor, and
   wherein a gate of the second NMOS transistor is electrically connected to the output end of the second comparator, a drain of the second NMOS transistor is electrically connected to the gate of the switch transistor, and a source of the second NMOS transistor is electrically connected to the low voltage.

9. An electric circuit device, comprising:
   a switch transistor protection device, configured in a switch transistor of a protection circuit device, and comprising:
      a voltage/current detection device, electrically connected to the switch transistor, and configured to detect a voltage of a gate, a body, a source or a drain of the switch transistor, or detect a current of the source or the drain of the switch transistor to generate a reference voltage accordingly; and
      a determination device, electrically connected to the voltage/current detection device and the switch transistor, and configured to determine whether the reference voltage exceeds an overcurrent voltage or a maximum junction temperature voltage, wherein the maximum junction temperature voltage is corresponding to a maximum junction temperature of the switch transistor, wherein when the determination device determines the reference voltage exceeds the maximum junction temperature voltage or the overcurrent voltage, the determination device generates a control signal to the gate, the body, the source or the drain of the switch transistor; and
   a functional circuit, comprising the switch transistor;

wherein the voltage/current detection device comprises a plurality of resistors, and the determination device comprises a comparator, and the plurality of resistors are electrically connected to the switch transistor to generate the reference voltage, and the comparator is configured to compare the reference voltage, the overcurrent voltage and the maximum junction temperature voltage.

10. The electric circuit device according to claim 9, further comprising a filter, and wherein the filter is electrically connected to the gate of the switch transistor, and the filter is configured to receive a switch control signal of the switch transistor.

11. The electric circuit device according to claim 10, further comprising a quick-pull circuit which comprises an NMOS transistor, and wherein a gate of the NMOS transistor is configured to receive the switch control signal, a drain of the NMOS transistor is electrically connected to the gate of the switch transistor, and a source of the NMOS transistor is electrically connected to a low voltage.

12. The electric circuit device according to claim 9, wherein the voltage/current detection device comprises a current sensor, and the determination device comprises a first comparator, a second comparator, a current source and a PMOS transistor, and wherein the current sensor is configured to generate an induced current via detecting a current flowing through the switch transistor, wherein the induced current and the current flowing through the switch transistor are changed in response to each other, wherein one end of the current source is connected to a negative input end of the second comparator, a drain of the PMOS transistor and one end of the current sensor generating the induced current, and configured to provide the overcurrent voltage, wherein the voltage/current detection device is configured to generate a first reference voltage, a second reference voltage and a third reference voltage, wherein the second comparator is configured to compare the third reference voltage and overcurrent voltage to generate the control signal, and wherein an output end of the first comparator is electrically connected to a gate of the PMOS transistor, and the first comparator is configured to compare whether the first reference voltage or the second reference voltage is greater than the maximum junction temperature voltage to control the PMOS transistor to be turned on or off.

13. The electric circuit device according to claim 12, further comprising a first filter electrically connected between the output end of the first comparator and the gate of the PMOS transistor.

14. The electric circuit device according to claim 13, further comprising a first quick-pull circuit which comprises a first NMOS transistor, and wherein a gate of the first NMOS transistor is electrically connected to the output end of the first comparator, a drain of the first NMOS transistor is electrically connected to the gate of the PMOS transistor, and a source of the first NMOS transistor is electrically connected to a low voltage.

15. The electric circuit device according to claim 14, further comprising a second filter, and the second filter is electrically connected between an output end of the second comparator and the gate of the switch transistor.

16. The electric circuit device according to claim 15, further comprising a second quick-pull circuit which includes a second NMOS transistor, and wherein a gate of the second NMOS transistor is electrically connected to the output end of the second comparator, a drain of the second NMOS transistor is electrically connected to the gate of the switch transistor, and a source of the second NMOS transistor is electrically connected to the low voltage.

* * * * *